United States Patent
Liu et al.

(10) Patent No.: US 10,790,310 B2
(45) Date of Patent: Sep. 29, 2020

(54) ARRAY SUBSTRATE, DISPLAY PANEL AND DISPLAY DEVICE WITH METAL CONNECTING MEMBER TO REDUCE CONTACT RESISTANCE

(71) Applicants: BOE Technology Group Co., Ltd., Beijing (CN); Ordos Yuansheng Optoelectronics Co., Ltd., Inner Mongolia (CN)

(72) Inventors: Hong Liu, Beijing (CN); Xinguo Wu, Beijing (CN); Fengguo Wang, Beijing (CN); Dawei Shi, Beijing (CN); Zifeng Wang, Beijing (CN); Wentao Wang, Beijing (CN); Lu Yang, Beijing (CN); Feng Li, Beijing (CN); Zhixuan Guo, Beijing (CN); Yuanbo Li, Beijing (CN); Bo Ma, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 204 days.

(21) Appl. No.: 16/070,598

(22) PCT Filed: Jan. 3, 2018

(86) PCT No.: PCT/CN2018/070097
§ 371 (c)(1),
(2) Date: Jul. 17, 2018

(87) PCT Pub. No.: WO2018/223689
PCT Pub. Date: Dec. 13, 2018

(65) Prior Publication Data
US 2020/0176477 A1    Jun. 4, 2020

(30) Foreign Application Priority Data

Jun. 8, 2017 (CN) .......................... 2017 1 0429457

(51) Int. Cl.
*H01L 27/12* (2006.01)
*G06F 3/041* (2006.01)
*H01L 29/423* (2006.01)

(52) U.S. Cl.
CPC .......... *H01L 27/124* (2013.01); *G06F 3/0412* (2013.01); *H01L 29/42384* (2013.01)

(58) Field of Classification Search
CPC ............. H01L 27/124; H01L 29/42384; G06F 3/0412
See application file for complete search history.

(56) References Cited

U.S. PATENT DOCUMENTS

2016/0246427 A1    8/2016  Ming et al.
2017/0185191 A1*   6/2017  Kim ...................... G06F 3/0412
2018/0341355 A1    11/2018 Li et al.

FOREIGN PATENT DOCUMENTS

CN          104461142 A      3/2015
CN          104503172 A      4/2015
(Continued)

OTHER PUBLICATIONS

CN106020544A Machine Translation to English (Year: 2016).*
(Continued)

*Primary Examiner* — Liliana Cerullo
(74) *Attorney, Agent, or Firm* — Westman, Champlin & Koehler, P.A.

(57) ABSTRACT

An array substrate, a display panel and a display device are provided. The array substrate includes a base substrate, and a metal connecting member, a first insulating layer, a signal line, a second insulating layer and a first electrode which are disposed on the base substrate in this order. The first insulating layer is located between the metal connecting
(Continued)

member and the signal line, and the second insulating layer is located between the signal line and the common electrode. A material of the metal connecting member is different from a material of the signal line. The signal line is electrically connected to the first electrode through the metal connecting member. A contact resistance between the material of the metal connecting member and a material of the first electrode is smaller than a contact resistance between the material of the signal line and the material of the first electrode.

18 Claims, 5 Drawing Sheets

(56) References Cited

FOREIGN PATENT DOCUMENTS

| CN | 106020544 A | 10/2016 |
|----|-------------|---------|
| CN | 107193422 A | 9/2017  |

OTHER PUBLICATIONS

English translation of International Search Report, Written Opinion, including English translation of Box V, for International Application No. PCT/CN2018/070097, dated Mar. 30, 2018, 9 pages.

\* cited by examiner

ARRAY SUBSTRATE, DISPLAY PANEL AND DISPLAY DEVICE WITH METAL CONNECTING MEMBER TO REDUCE CONTACT RESISTANCE

CROSS-REFERENCE TO RELATED APPLICATION

This application is a Section 371 National Stage Application of International Application No. PCT/CN2018/070097 filed on Jan. 3, 2018 and entitled "ARRAY SUBSTRATE, DISPLAY PANEL AND DISPLAY DEVICE", which claims priority to Chinese Patent Application No. 201710429457.8 filed on Jun. 8, 2017 in the State Intellectual Property Office of China, the disclosure of which is hereby incorporated by reference in its entirety.

TECHNICAL FIELD

Embodiments of the present disclosure relate to the field of display technology, and in particular, to an array substrate, a display panel, and a display device.

DESCRIPTION OF THE RELATED ART

With the rapid development of display technology, touch screens are gradually spreading in people's lives. At present, the touch screens may be divided into an add-on mode touch screen, an on-cell touch screen and an in-cell touch screen according to their structures. In order to produce the add-on mode touch screen, a touch panel and a liquid crystal display (LCD) panel are produced separately, and then bonded together to form a liquid crystal display with a touch function. The add on mode touch screen has disadvantages such as high production cost, low light transmittance and large cell thickness. In the in-cell touch screen, touch electrodes of the touch screen are embedded in an interior of a liquid crystal display, so that an overall cell thickness may be reduced and the production cost of the touch screen may be greatly reduced, thus it is favored by major screen manufacturers.

However, it is desirable to achieve effective contact between a touch signal line and a common electrode, thereby reducing a contact resistance and improving a detection accuracy of a touch position on the touch screen.

SUMMARY

Embodiments of the present disclosure provide an array substrate, a display panel and a display device, which may achieve an effective contact between a touch signal line and a first electrode, reduce a contact resistance, and improve a detection accuracy of a touch position on a touch screen.

An embodiment of the present disclosure provides an array substrate, comprising a base substrate, a metal connecting member, a first insulating layer, a signal line, a second insulating layer and a first electrode, wherein the metal connecting member, the first insulating layer, the signal line, the second insulating layer and the common electrode are disposed on the base substrate in this order, the first insulating layer is located between the metal connecting member and the signal line, the second insulating layer is located between the signal line and the common electrode, and a material of the metal connecting member is different from a material of the signal line, and wherein the signal line is electrically connected to the first electrode through the metal connecting member, and a contact resistance between the material of the metal connecting member and a material of the first electrode is smaller than a contact resistance between the material of the signal line and the material of the first electrode.

In an alternative embodiment, the above array substrate provided by the embodiment of the present disclosure, further comprising: a thin film transistor between the first electrode and the base substrate, wherein the signal line is formed of the same material and disposed in the same layer as both a source electrode and a drain electrode of the thin film transistor.

In an alternative embodiment, in the above array substrate provided by the embodiment of the present disclosure, the signal line comprises at least two metal materials arranged in a stacked manner.

In an alternative embodiment, in the above array substrate provided by the embodiment of the present disclosure, the signal line is composed of two layers of metal titanium material and one layer of metal aluminum material, and the layer of metal aluminum material is sandwiched between the two layers of metal titanium material.

In an alternative embodiment, the above array substrate provided by the embodiment of the present disclosure, further comprising: a thin film transistor between the first electrode and the base substrate, wherein the metal connecting member is formed of the same material and disposed in the same layer as a gate electrode of the thin film transistor.

In an alternative embodiment, the array substrate further comprising a via-hole for forming an electrical connection between the metal connecting member and the first electrode.

In an alternative embodiment, in the above array substrate provided by the embodiment of the present disclosure, the thin film transistor is a top-gate thin film transistor or a bottom-gate thin film transistor.

In an alternative embodiment, the above array substrate provided by the embodiment of the present disclosure, further comprising: a thin film transistor between the first electrode and the base substrate, the thin film transistor is a top-gate thin film transistor, the array substrate further comprises a light shielding layer between the base substrate and the thin film transistor, and an orthogonal projection of the light shielding layer on the base substrate covers an orthogonal projection of an active layer of the thin film transistor on the base substrate, and the metal connecting member is formed of the same material and disposed in the same layer as the light shielding layer.

In an alternative embodiment, the orthogonal projection of the light shielding layer on the base substrate coincides with the orthogonal projection of the active layer of the thin film transistor on the base substrate.

In an alternative embodiment, in the above array substrate provided by the embodiment of the present disclosure, the metal connecting member comprises metal molybdenum material.

In an alternative embodiment, in the above array substrate provided by the embodiment of the present disclosure, the common electrode is a touch electrode, and the signal line is a touch signal line.

In an alternative embodiment, the array substrate further comprising a gate insulating layer between the light shielding layer and a gate electrode of the thin film transistor, wherein the gate insulating layer is located between the first insulating layer and the metal connecting member, and a via-hole is provided to electrically connect the metal connecting member to the first electrode, and the via-hole comprises a first portion penetrating the first insulating layer and the second insulating layer, and a second portion penetrating the gate insulating layer, and a sectional dimension of the first portion is greater than a sectional dimension of the second portion.

In an alternative embodiment, the first electrode is a common electrode.

In an alternative embodiment, a material of the common electrode comprises indium tin oxide.

In an alternative embodiment, the common electrode is a touch electrode, and the signal line is a touch signal line.

In an alternative embodiment, the common electrode comprises a plurality of block electrodes.

An embodiment of the present disclosure provides a display panel comprising the array substrate provided by the embodiment of the present disclosure.

An embodiment of the present disclosure provides a display device comprising the display panel provided by the embodiment of the present disclosure.

DETAILED DESCRIPTION OF THE EMBODIMENTS

Specific implementations of an array substrate, a display panel, and a display device provided by embodiments of the present disclosure will be described in detail below with reference to the accompanying drawings. It should be noted that the described embodiments are merely a part of, but not all, the embodiments of the present disclosure. All other embodiments, which are obtained by those skilled in the art based on the embodiments of the present disclosure without any creative efforts, shall fall within the protection scope of the present disclosure.

Figure 1:
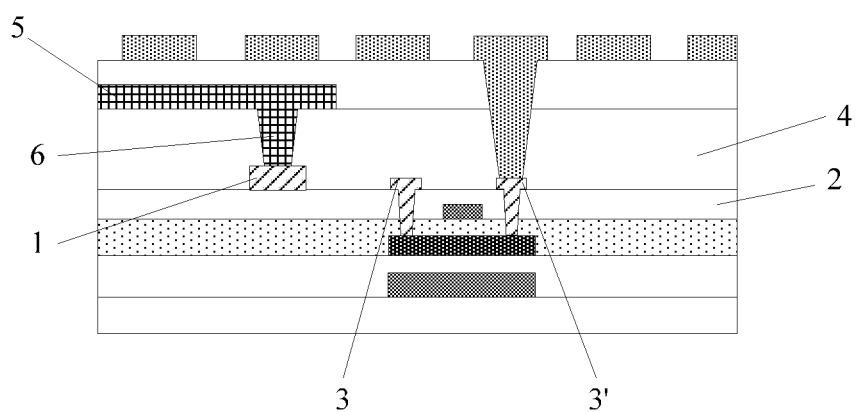
FIG. 1 is a schematic cross-sectional view of an array substrate in the related art.

At present, in an in-cell touch panel, a touch signal line is directly electrically connected to a touch electrode to realize a touch signal transmission. FIG. 1 shows a schematic cross-sectional view of an array substrate. The touch signal line 1 is located on the insulating layer 2. The touch signal line 1 is made of the same material and located in the same layer as a source electrode 3 and a drain electrode 3'. The touch electrode 5 is located on a planarization layer 4, and is electrically connected to the touch signal line 1 through a via-hole 6 in the planarization layer 4. Typically, the touch signal line 1 is composed of stacked layers of metal titanium (Ti) and metal aluminum (Al), for example, a first layer is Ti, a second layer is Al, and a third layer is Ti. The touch electrode 5 may serve as a common electrode at the same time and is typically made of indium tin oxide material (ITO). In a process of manufacturing an array substrate, titanium (Ti) is easily oxidized, so that there will be a large contact resistance when the oxidized Ti layer of the touch signal line comes into contact with the ITO, thereby affecting a touch signal transmission adversely. As a result, a detection accuracy of a touch position on the touch screen is also adversely affected.

Figure 2:
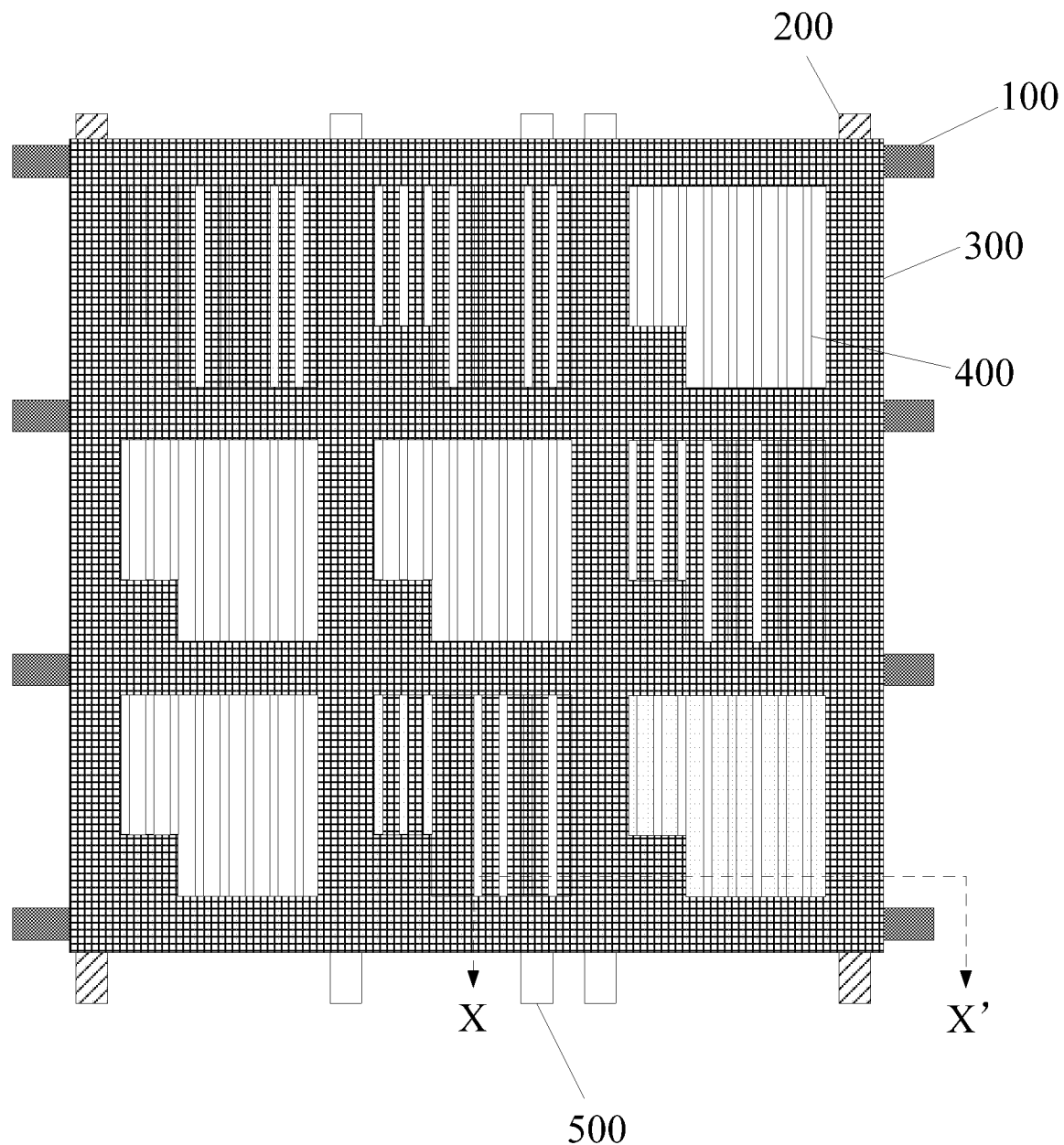
FIG. 2 is a top view of an array substrate provided by an embodiment of the present disclosure.

An embodiment of the present disclosure provides an array substrate, as shown in a top view of the array substrate in FIG. 2. A reference numeral 100 represents a gate line, a reference numeral 200 represents a data line, a reference numeral 300 represents a common electrode, and the common electrode 300 may be planar or may be in block form, a reference numeral 400 represents a slit-shaped pixel electrode, but the pixel electrode 400 is not limited to this structure, a reference numeral 500 represents a signal line electrically connected to the common electrode 300.

Specifically, schematic cross-sectional views taken along a line X-X' shown in FIG. 2 are shown in FIGS. 3 to 6, the above-mentioned array substrate provided by the embodiment of the present disclosure may include: a base substrate 10, a metal connecting member 20, a first insulating layer 30, a signal line 500, a second insulating layer 40 and a first electrode, such as common electrode 300. The metal connecting member 20, the first insulating layer 30, the signal line 500, the second insulating layer 40 and the common electrode 300 are disposed on the base substrate 10 in this order. A material of the metal connecting member 20 and a material of the signal line 500 may be different.

In the embodiment, the signal line 500 is electrically connected to the common electrode 300 through the metal connecting member 20, and a contact resistance between the material of the metal connecting member 20 and a material of the common electrode 300 is smaller than a contact resistance between the material of the signal line 500 and the material of the common electrode 300.

In the above-mentioned array substrate provided by the embodiment of the present disclosure, the metal connecting member 20 is provided to realize an electrical connection between the signal line 500 and the common electrode 300, and the contact resistance between the metal connecting member 20 and the common electrode 300 is relatively small, so that an effective contact between the metal connecting member 20 and the common electrode 300 may be achieved. In this way, it facilitates transmitting a signal of the common electrode 300 to a corresponding chip through the signal line 500, and a poor signal transmission due to a large contact resistance between the signal line 500 and the common electrode 300 may be effectively avoided.

In a specific implementation, in order to simplify the manufacturing process and reduce the manufacturing cost, the signal line 500 may be formed of the same material and disposed in the same layer as both a source electrode 51 and a drain electrode 51' of a thin film transistor in the array substrate, that is, the signal line 500, the source electrode 51 and the drain electrode 51' may be formed through one patterning process. Therefore, as shown in FIG. 3 to FIG. 6, the above-mentioned array substrate provided by the embodiment of the present disclosure may further include: a thin film transistor 50 disposed between the common electrode 300 and the base substrate 10.

In the embodiment, the signal line 500 is formed of the same material and disposed in the same layer as both the source electrode 51 and the drain electrode 51' of the thin film transistor 50.

Specifically, when manufacturing the signal line, in order to reduce the contact resistance between the signal line and a corresponding component, achieve an effective contact between the signal line and the corresponding component, and facilitate an effective signal transmission, the signal line is generally formed of a plurality of metal materials, and a specific structure of the signal line is designed according to work functions of different metals. Therefore, in the array substrate provided by the embodiments of the present disclosure, the signal line may include at least two metal materials which are disposed in a stacked manner.

Further, in a case that the signal line is composed of two kinds of metal materials, in the array substrate provided by the embodiments of the present disclosure, the signal line may be composed of two layers of metal titanium material and one layer of metal aluminum material, and the metal aluminum material is sandwiched between the two layers of metal titanium material.

The signal lines may be manufactured without limiting to metal titanium material and the metal aluminum material. In other embodiments, other metal materials which meet actual needs may also be used. Moreover, the signal line may have a two-layer structure, and is not limited to the above three-layer structure, which is not limited here.

In a specific implementation, in a cross-sectional structure of the array substrate shown in FIGS. 3 to 6, the thin film transistor 50 may be a top-gate thin film transistor, or may also be a bottom-gate thin film transistor. Specifically, in the embodiments shown in FIGS. 3 to 5, the thin film transistor is a top-gate thin film transistor, and it may include structurally from top to bottom: a source electrode 51 1 and a drain electrode 51', a first insulating layer 30, a gate electrode 52, a gate insulating layer 53 and an active layer 54. In the embodiment shown in FIG. 6, the thin film transistor 50 is bottom-gate thin film transistor, and it may include structurally from top to bottom: a source electrode 51 and a drain electrode 51', a first insulating layer 30, an active layer 54, a gate insulating layer 53 and a gate electrode 52.

Figure 5:
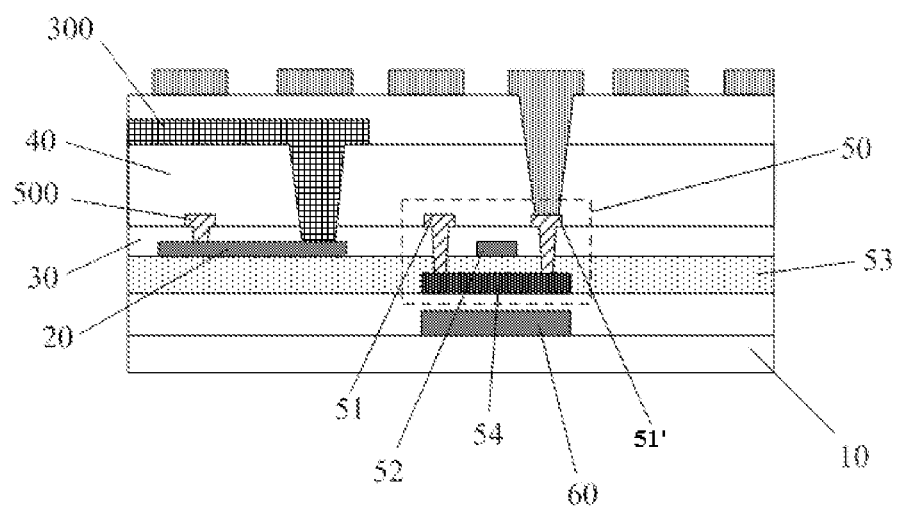
Figure 6:
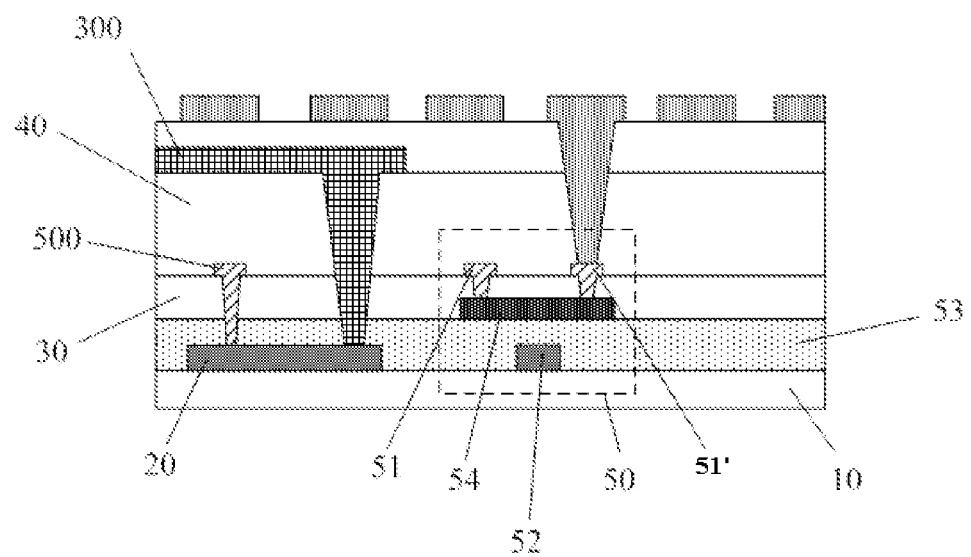

Specifically, regardless of the top-gate thin film transistor and the bottom-gate thin film transistor, in the above array substrate provided by the embodiments of the present disclosure, as shown in FIG. 5 and FIG. 6, the metal connecting member 20 may be formed of the same material and located in the same layer as the gate electrode 52 of the thin film transistor 50.

Figure 3:
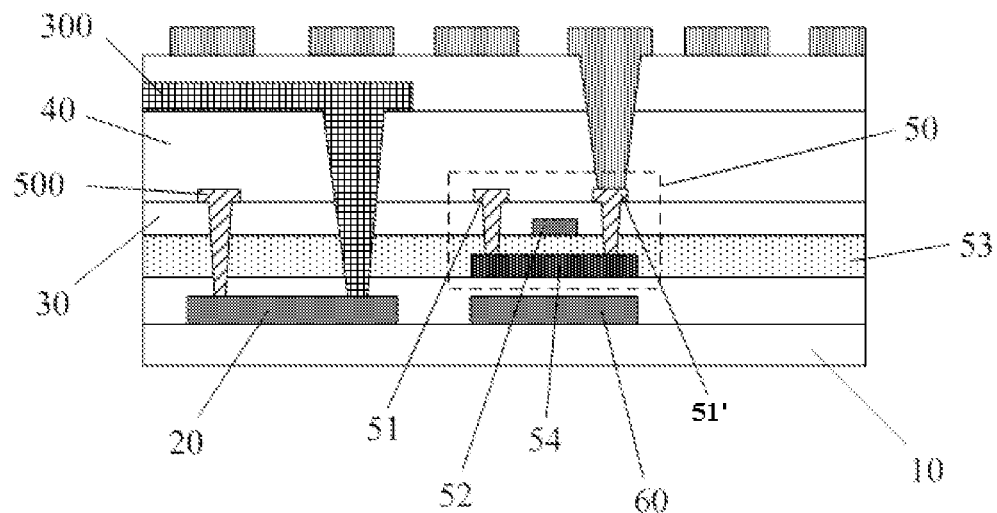
FIGS. 3 to 6 are schematic cross-sectional views of the array substrate taken along a line X-X' shown in FIG. 2.
Figure 4:
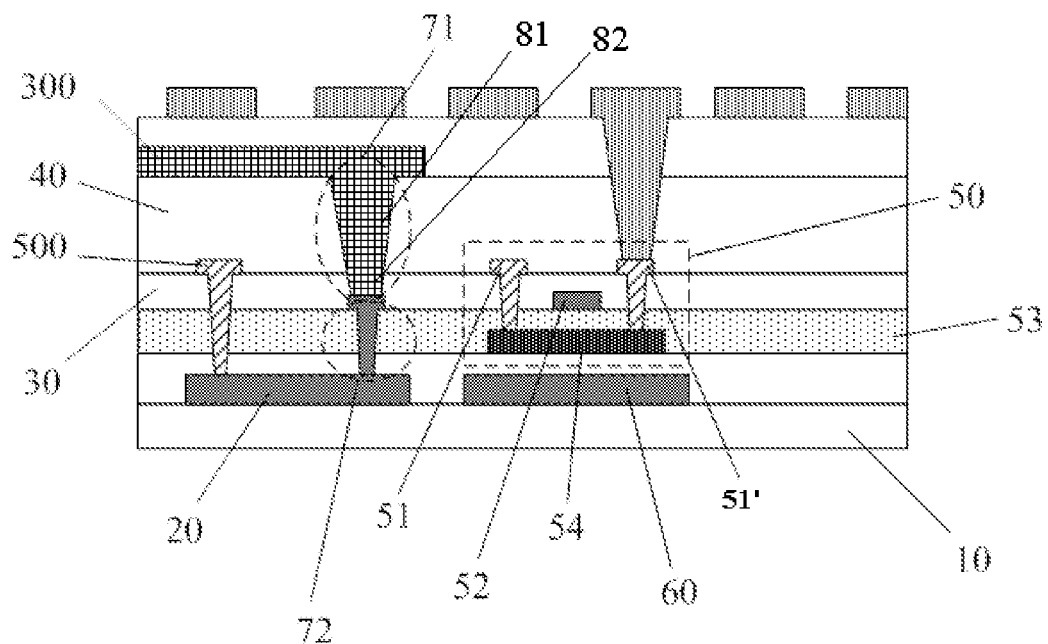

Specifically, in a case that the thin film transistor is a top-gate thin film transistor, in the above array substrate provided by the embodiment of the present disclosure, as shown in FIGS. 3 to 5, the array substrate may further include a light shielding layer 60 disposed between the base substrate 10 and the thin film transistor 50. An orthogonal projection of the light shielding layer 60 on the base substrate 10 may cover an orthogonal projection of the active layer 54 of the thin film transistor 50 on the base substrate 10, so as to prevent backlight from entering into the active layer 54, which otherwise produces photo-generated carriers to affect adversely an activity of the active layer 54. In an embodiment, the orthogonal projection of the light shielding layer 60 on the base substrate 10 may coincide with the orthogonal projection of the active layer 54 of the thin film transistor 50 on the base substrate 10, as shown in FIG. 3 and FIG. 5. In another embodiment, the orthogonal projection of the active layer 54 of the thin film transistor 50 on the base substrate 10 completely falls within the orthogonal projection of the light shielding layer 60 on the base substrate 10, as shown in FIG. 4. In addition, in the embodiments shown in FIG. 3 and FIG. 4, in order to simplify the manufacturing process and reduce the manufacturing cost, the metal connecting member 20 may be formed of the same material and disposed in the same layer as the light shielding layer 60. For example, the metal connecting member 20 and the light shielding layer 60 may be formed through one patterning process, thereby reducing the number of patterning and exposure, simplifying the manufacturing process and reducing the manufacturing cost.

In a specific implementation, as shown in FIGS. 3 to 6, in the array substrate provided by the embodiments of the present disclosure, in order to achieve the electrical connection between the common electrode 300 and the metal connecting member 20, it is required to provide a via-hole in film layers between a layer where the metal connecting member 20 is located and a layer where the common electrode 300 is located. The number of the film layers between the layer where the metal connecting member 20 is located and the layer where the common electrode 300 is located is at least two. The second insulating layer 40 is generally also referred to as a planarization layer, which is configured to provide a flat surface for the common electrode 300. As the thickness of the planarization layer is generally large, the via-hole is deep, resulting in an increased difficulty for forming the via-hole and a poor contact between the common electrode 300 and the metal connecting member 20. In order to avoid these problems, in combination with the structure of the array substrate shown in FIG. 4, the via-hole may include a first portion 71 penetrating both the second insulating layer 40 and the first insulating layer 30 and a second portion 72 penetrating the gate insulating layer 53, and a diameter of the first portion may be larger than a diameter of the second portion 72, as shown in FIG. 4. In other words, the via-hole may be of a nesting hole structure. In this way, the poor contact between the common electrode 300 and the metal connecting member 20 may be effectively avoided, and the difficulty for forming the via-hole may be reduced. In addition, in the embodiment of the present disclosure, the via-hole is provided to form the electrical connection between the metal connecting member 20 and the common electrode 300. As a thickness of the second insulating layer 40 is greater than a thickness of the first insulating layer 30, the first portion 71 may include a first sub-portion 81 penetrating the second insulating layer 40 and a second sub-portion 82 penetrating the first insulating layer 30, and a sectional dimension of the first sub-portion 81 is greater than a sectional dimension of the second sub-portion 82 (as shown in FIG. 4).

In a specific implementation, when the above array substrate provided by the embodiments of the present disclosure is applied to the in-cell touch screen, a planar common electrode is generally divided into a plurality of blocks, which are regularly arranged, to form block electrodes. The block electrodes may be used as touch electrodes. When the array substrate is an array substrate of a liquid crystal display panel, the block electrodes may also cooperate with pixel electrodes to form electric fields, so as to drive liquid crystal for display. In the above array substrate provided by the embodiments of the present disclosure, the signal line may be a touch signal line, for transmitting touch signals received when the common electrodes are used as the touch electrodes to a touch control chip, so as to realize a touch control function.

Specifically, the common electrode is generally made of a transparent conductive oxide, such as indium tin oxide (ITO). Of course, it is not limited to ITO. Generally, a contact resistance between ITO and oxidized metal titanium (Ti) is relatively large, in contrast, a contact resistance between ITO and metal molybdenum (Mo) is relatively small. Therefore, in the above array substrate provided by the embodiments of the present disclosure, the metal connecting member includes a metal molybdenum material.

Further, in a case that the metal connecting member is formed of the same material and disposed in the same layer as the gate electrode of the thin film transistor, both the metal connecting member and the gate electrode of the thin film transistor may be made of metal molybdenum material. In a case that the metal connecting member is formed of the same material and disposed in the same layer as the light shielding layer, both the metal connecting member and the light shielding layer may be made of metal molybdenum material. In other words, the metal connecting member and the gate electrode may be formed through one patterning process, alternatively the metal connecting member and the light shielding layer may be formed through one patterning process, thereby greatly simplifying the manufacturing process and saving the manufacturing cost.

Figure 7:
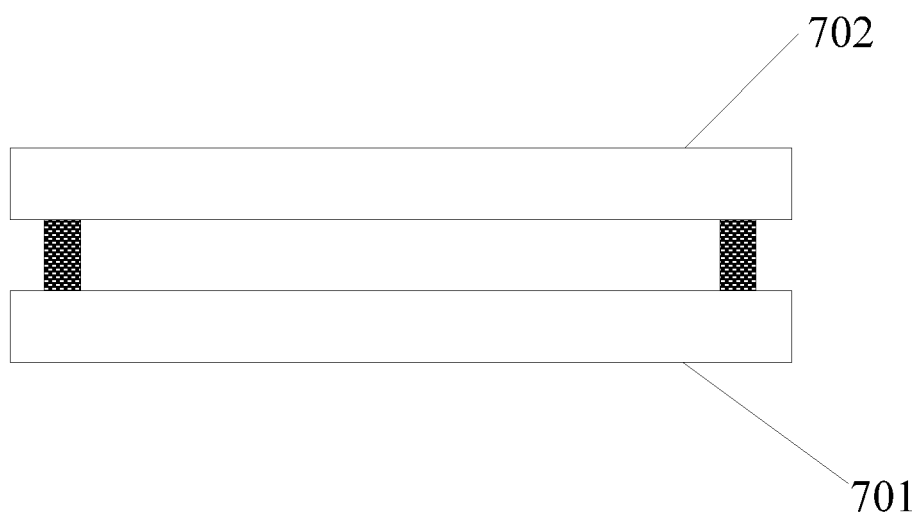
FIG. 7 is a schematic structural view of a display panel provided by an embodiment of the present disclosure.

Based on the same inventive concept, an embodiment of the present disclosure further provides a display panel. As shown in FIG. 7, the display panel may include an array substrate 701. The array substrate 701 may be the above array substrate provided by the embodiments of the present disclosure. In a case that the display panel is a liquid crystal display panel, the display panel further includes an opposite substrate 702 opposite to the array substrate 701.

Based on the same inventive concept, an embodiment of the present disclosure further provides a display device, which may include the above-mentioned display panel provided by the embodiment of the present disclosure. The display device may be any products or components having display function, such as a mobile phone, a tablet computer, a notebook computer, a desktop computer, a television, a navigator and the like. Since the display device is similar in a principle of solving a problem to the display panel, specific implementations of the display device may refer to the implementations of the above-mentioned display panel, and the repeated descriptions will be omitted here.

An embodiment of the present disclosure provides an array substrate, a display panel and a display device. The array substrate includes: a base substrate, and a metal connecting member, a first insulating layer, a signal line, a second insulating layer and a first electrode, such as a common electrode, which are disposed on the base substrate in this order. The material of the metal connecting member is different from the material of the signal line. The signal line is electrically connected to the common electrode through the metal connecting member. The contact resistance between the metal connecting member and the common electrode is smaller than the contact resistance between the signal line and the common electrode. Therefore, the metal connecting member is provided to realize the electrical connection between the signal line and the common electrode, and the contact resistance between the metal connecting member and the common electrode is relatively small, so that the effective contact between the metal connecting member and the common electrode may be achieved. In this way, it facilitates transmitting a signal of the common electrode to a corresponding chip through the signal line, and a poor signal transmission due to a large contact resistance between the signal line and the common electrode may be effectively avoided.

It will be apparent to those skilled in the art that various modifications and variations can be made to the present disclosure without departing from the spirit and scope of the present disclosure. Thus, if these modifications and variations of the present disclosure fall within the scope of the claims of the present disclosure and their equivalent technologies, the present disclosure also intends to include these modifications and variations.

What is claimed is:

1. An array substrate comprising a base substrate, a metal connecting member, a first insulating layer, a signal line, a second insulating layer and a first electrode,
    wherein the metal connecting member, the first insulating layer, the signal line, the second insulating layer and the first electrode are disposed on the base substrate in this sequence, the first insulating layer is located between the metal connecting member and the signal line, the second insulating layer is located between the signal line and the first electrode, and a material of the metal connecting member is different from a material of the signal line, and
    wherein the signal line is electrically connected to the first electrode through the metal connecting member, and a contact resistance between the material of the metal connecting member and a material of the first electrode is smaller than a contact resistance between the material of the signal line and the material of the first electrode.

2. The array substrate according to claim 1, further comprising: a thin film transistor between the first electrode and the base substrate, wherein the signal line is formed of the same material and disposed in the same layer as both a source electrode and a drain electrode of the thin film transistor.

3. The array substrate according to claim 1, wherein the signal line comprises at least two metal materials arranged in a stacked manner.

4. The array substrate according to claim 3, wherein the signal line is composed of two layers of metal titanium material and one layer of metal aluminum material, and the layer of metal aluminum material is sandwiched between the two layers of metal titanium material.

5. The array substrate according to claim 1, further comprising: a thin film transistor between the first electrode and the base substrate, wherein the metal connecting member is formed of the same material and disposed in the same layer as a gate electrode of the thin film transistor.

6. The array substrate according to claim 5, wherein the thin film transistor is a top-gate thin film transistor or a bottom-gate thin film transistor.

7. The array substrate according to claim 1, further comprising a via-hole for forming an electrical connection between the metal connecting member and the first electrode.

8. The array substrate according to claim 1, further comprising: a thin film transistor between the first electrode and the base substrate,
    wherein the thin film transistor is a top-gate thin film transistor,
    the array substrate further comprises a light shielding layer between the base substrate and the thin film transistor, and an orthogonal projection of the light shielding layer on the base substrate covers an orthogonal projection of an active layer of the thin film transistor on the base substrate, and
    the metal connecting member is formed of the same material and disposed in the same layer as the light shielding layer.

9. The array substrate according to claim 8, wherein the orthogonal projection of the light shielding layer on the base substrate coincides with the orthogonal projection of the active layer of the thin film transistor on the base substrate.

10. The array substrate according to claim 8, further comprising a gate insulating layer between the light shielding layer and a gate electrode of the thin film transistor,
    wherein the gate insulating layer is located between the first insulating layer and the metal connecting member, and a via-hole is provided to electrically connect the metal connecting member to the first electrode, and the via-hole comprises a first portion penetrating the first insulating layer and the second insulating layer, and a second portion penetrating the gate insulating layer, and a sectional dimension of the first portion is greater than a sectional dimension of the second portion.

11. The array substrate according to claim 1, wherein the metal connecting member comprises metal molybdenum material.

12. The array substrate according to claim 1, wherein the first electrode is a touch electrode, and the signal line is a touch signal line.

13. A display panel comprising the array substrate according to claim 1.

14. A display device comprising the display panel according to claim 13.

15. The array substrate according to claim 1, wherein the first electrode is a common electrode.

16. The array substrate according to claim 15, wherein a material of the common electrode comprises indium tin oxide.

17. The array substrate according to claim 15, wherein the common electrode is a touch electrode, and the signal line is a touch signal line.

18. The array substrate according to claim 17, wherein the common electrode comprises a plurality of block electrodes.

\* \* \* \* \*